(12) United States Patent
Kamikawa

(10) Patent No.: US 9,437,787 B2
(45) Date of Patent: Sep. 6, 2016

(54) SEMICONDUCTOR LIGHT EMITTING DEVICE

(71) Applicant: Sharp Kabushiki Kaisha, Osaka-shi (JP)

(72) Inventor: Takeshi Kamikawa, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 14/361,216

(22) PCT Filed: May 29, 2013

(86) PCT No.: PCT/JP2013/064909
§ 371 (c)(1),
(2) Date: May 28, 2014

(87) PCT Pub. No.: WO2013/190962
PCT Pub. Date: Dec. 27, 2013

(65) Prior Publication Data
US 2014/0353704 A1    Dec. 4, 2014

(30) Foreign Application Priority Data
Jun. 18, 2012   (JP) ................. 2012-136538

(51) Int. Cl.
*H01L 33/00* (2010.01)
*H01L 33/50* (2010.01)
*H01L 23/00* (2006.01)
*H01L 33/56* (2010.01)
*H01L 33/60* (2010.01)
*H01L 33/48* (2010.01)
*H01L 33/64* (2010.01)

(52) U.S. Cl.
CPC ............ *H01L 33/502* (2013.01); *H01L 24/29* (2013.01); *H01L 33/56* (2013.01); *H01L 33/483* (2013.01);
(Continued)

(58) Field of Classification Search
CPC ... H01L 24/29; H01L 33/502; H01L 33/483; H01L 33/507; H01L 33/60; H01L 33/641; H01L 2224/45144; H01L 2224/48091; H01L 2224/48465; H01L 2224/49107; H01L 2224/73265; H01L 2924/12041
See application file for complete search history.

(56) References Cited

U.S. PATENT DOCUMENTS 9,006,761 B2 *   4/2015   Oyamada .............. H01L 33/504
                                                            257/301
2002/0163302 A1 * 11/2002  Nitta et al. .................... 313/512
(Continued)

FOREIGN PATENT DOCUMENTS

CN          1523683         8/2004
JP          2001-7405       1/2001
(Continued)

OTHER PUBLICATIONS

International Search Report mailed Jun. 25, 2013, directed to International Application No. PCT/JP2013/064909; 5 pages.

*Primary Examiner* — Su C Kim
*Assistant Examiner* — Junaiden Mirsalahuddin
(74) *Attorney, Agent, or Firm* — Morris & Foerster LLP

(57) ABSTRACT

A semiconductor light emitting device includes: a semiconductor light emitting element including a transparent substrate; a reflective substrate on which the semiconductor light emitting element is mounted; an adhesive layer containing a fluorescent substance, for fixing the semiconductor light emitting element on the reflective substrate; and a sealing member containing a fluorescent substance, for sealing the semiconductor light emitting element. In the semiconductor light emitting device, the adhesive layer has a thickness equal to or smaller than average particle size of the fluorescent substance contained in the sealing member.

7 Claims, 6 Drawing Sheets

(52) U.S. Cl.
CPC .............. *H01L 33/507* (2013.01); *H01L 33/60* (2013.01); *H01L 33/641* (2013.01); *H01L 2224/45144* (2013.01); *H01L 2224/48091* (2013.01); *H01L 2224/48465* (2013.01); *H01L 2224/49107* (2013.01); *H01L 2224/73265* (2013.01); *H01L 2924/12041* (2013.01); *H01L 2924/12042* (2013.01); *H01L 2924/15747* (2013.01); *H01L 2924/15787* (2013.01); *H01L 2924/181* (2013.01)

(56) References Cited

U.S. PATENT DOCUMENTS

| | | |
|---|---|---|
| 2004/0164311 A1 | 8/2004 | Uemura |
| 2004/0188700 A1* | 9/2004 | Fukasawa et al. ............ 257/100 |
| 2007/0080636 A1* | 4/2007 | Lee ..................... H05B 33/04 313/512 |
| 2007/0096113 A1* | 5/2007 | Inoshita ................ H01L 33/507 257/79 |
| 2008/0231170 A1* | 9/2008 | Masato et al. ................ 313/501 |
| 2010/0258825 A1 | 10/2010 | Ohta et al. |
| 2011/0147776 A1* | 6/2011 | Hikosaka et al. .............. 257/98 |

FOREIGN PATENT DOCUMENTS

| | | |
|---|---|---|
| JP | 2001-36150 | 2/2001 |
| JP | 2002-314142 | 10/2002 |
| JP | 2002-368261 | 12/2002 |
| JP | 2004-71710 | 3/2004 |
| JP | 2009-267289 | 11/2009 |
| JP | 2010-245481 | 10/2010 |
| JP | 2010-283244 | 12/2010 |
| JP | 2011-134761 | 7/2011 |
| JP | 2012-87162 | 5/2012 |

* cited by examiner

FIG.3

| WAVELENGTH (nm) | REFLECTANCE(%) | | |
|---|---|---|---|
| | Ag | Au | RHODIUM |
| 450 | 96.6 | 38.7 | 77.2 |
| 550 | 97.9 | 81.7 | 78 |
| 650 | 98.3 | 95.5 | 79.9 |

SEMICONDUCTOR LIGHT EMITTING DEVICE

CROSS-REFERENCE TO RELATED APPLICATIONS

This application is a national phase filing under 35 U.S.C. §371 of International Application No. PCT/JP2013/064909, filed on May 29, 2013, and which claims priority to Japanese Patent Application No. 2012-136538, filed on Jun. 18, 2012, the entire contents of which are incorporated herein by reference.

FIELD OF THE INVENTION

The present invention relates to a semiconductor light emitting device including a semiconductor light emitting element as a light source.

BACKGROUND OF THE INVENTION

Conventionally, semiconductor light emitting devices including semiconductor light emitting elements as light sources have been known. Generally, for such semiconductor light emitting devices, a light emitting element (light emitting diode element) using a nitride-based semiconductor is mounted. A semiconductor light emitting element using a transparent substrate of, for example, sapphire substrate, has been known as an example of the light emitting element using nitride-based semiconductor. In such a semiconductor light emitting element, a multi-layered film of nitride-based semiconductor including a light emitting layer is formed on the transparent substrate. On the multi-layered film, typically, an electrode layer including a light transmitting electrode and a pad electrode is formed.

In a semiconductor light emitting element, light emitted downward from the light emitting layer enters the transparent substrate and is reflected from the back surface side of the substrate. The light reflected from the back surface side of the substrate returns to the upper part of the semiconductor light emitting element, and part of the light enters the semiconductor multi-layered film. The light that has entered the multi-layered film passes through the multi-layered film and the like and is taken out to the outside of the light emitting element. Part of the light, however, is absorbed, for example, by the light transmitting electrode, the pad electrode and the light emitting layer. Therefore, light extracting efficiency is higher when the light reflected from the back surface side of the substrate is taken out from a side surface of the transparent substrate than when the light is taken out from the upper surface side (on which the multi-layered film is formed) of the light emitting element.

By way of example, assume that a sapphire substrate is used as the transparent substrate and the light is directly extracted to the air from a side surface of the sapphire substrate. Here, the angle of total reflection ($\theta_{side}$: if the light is incident on the side surface of substrate with this or larger angle with respect to the vertical direction, the light is totally reflected) at the interface between the sapphire substrate (refractive index=1.78) and the air (refractive index=1) is $\theta_{side} \geq 34.18°$. Specifically, consider the light emitted downward from the light emitting layer and entered the sapphire substrate. Of the light beams directly proceeded to or reflected by the back surface of sapphire substrate and directed to the side surface of sapphire substrate, those incident on the side surface of sapphire substrate with the angle of $34.18° \leq \theta_{side} \leq 90°$ with respect to the vertical direction of the substrate side surface are not taken out from the side surface of sapphire substrate but returned toward the side of multi-layered film of nitride-based semiconductor including the light emitting layer formed on the sapphire substrate. On the other hand, light beams with the incident angle of $\theta_{side} < 34.18°$ are emitted to the air from the side surface of sapphire substrate.

A semiconductor light emitting element is generally mounted on a stem or the like and sealed with transparent resin having the refractive index of about 1.4 to about 1.5. Here, the difference in refractive index between the transparent substrate and the transparent resin is smaller than the difference in refractive index between the transparent substrate and the air. Therefore, total reflection of light at the side surface of transparent substrate is less likely than when the side surface of transparent substrate is in contact with the air. As a result, it becomes easier to extract light with higher efficiency from the side surface of transparent substrate.

By way of example, assuming that the sealing resin has the refractive index of 1.5, the angle of total reflection at the interface with the side surface of sapphire substrate is $\theta_{side} \geq 57.43°$. Specifically, consider the light emitted downward from the light emitting layer and entered the sapphire substrate. Of the light beams directly proceeded to or reflected by the back surface of sapphire substrate and directed to the side surface of sapphire substrate, those incident on the side surface of sapphire substrate with the angle of $57.43° \leq \theta_{side} \leq 90°$ with respect to the vertical direction of the substrate side surface are not taken out from the side surface of sapphire substrate but returned toward the side of multi-layered film of nitride-based semiconductor including the light emitting layer formed on the sapphire substrate. On the other hand, light beams with the incident angle of $\theta_{side} < 57.43°$ are emitted to the transparent resin from the side surface of sapphire substrate. In this manner, by sealing the semiconductor light emitting element with the transparent resin, it becomes possible to extract larger amount of light from the side surface of sapphire substrate. It is noted, however, that still some amount of light is totally reflected at the side surface of sapphire substrate. Therefore, it is necessary to further improve the light extraction efficiency to minimize the totally reflected light.

Patent Literature 1 specified below proposes, as a solution to such a problem, to form irregularities on the back surface of transparent substrate. According to Patent Literature 1, light beams emitted downward from the light emitting layer, incident on the sapphire substrate, mirror-reflected by the back surface of sapphire substrate and again returned to the side of light emitting layer come to be reflected at angles different from those of the conventional examples because of the irregularities and, hence, it becomes easier to extract light from the side surface of substrate. According to Patent Literature 1, if the back surface of transparent substrate is in contact with air, there is a large difference in refractive index and, therefore, remarkable light scattering effect can be attained by the structure with irregularities. This enables improved efficiency of light extraction to the outside.

PATENT LITERATURE

PTL 1: Japanese Patent Laying-Open No. 2002-368261

SUMMARY OF THE INVENTION

When a light emitting element is mounted on a stem or the like, however, generally a transparent silicone resin or the like having refractive index of about 1.5 is used as a die bonding paste. In that case, the difference in refractive index becomes smaller and the light scattering effect attained by the structure with irregularities is reduced. As a result, if the light emitting element described in Patent Literature 1 is used for forming a semiconductor light emitting device, it is difficult to improve the efficiency of extracting light to the outside.

The present invention was made to solve the above-described problem and an object of the present invention is to provide a semiconductor light emitting device capable of improving the efficiency of extracting light to the outside.

In order to attain the above-described object, according to an aspect, the present invention provides a semiconductor light emitting device, including: a semiconductor light emitting element including a transparent substrate; a substrate on which the semiconductor light emitting element is mounted; an adhesive layer containing a fluorescent substance, for fixing the semiconductor light emitting element on the substrate; and a sealing member containing a fluorescent substance, for sealing the semiconductor light emitting element. The adhesive layer has a thickness equal to or smaller than average particle diameter of the fluorescent substance contained in the sealing member.

The semiconductor light emitting element including a transparent substrate is fixed on a substrate with a light transmitting adhesive layer interposed. Light beams emitted downward from the semiconductor light emitting element pass through the transparent substrate and enter the adhesive layer. Since the adhesive layer contains fluorescent substance, the light from semiconductor light emitting element is once absorbed by the fluorescent substance and converted to light having longer wavelength. The light with the converted wavelength is emitted as fluorescent light from the fluorescent substance. Further, since the direction of light reflection (direction of fluorescent light emission) is altered by the fluorescent substance contained in the adhesive layer, it becomes easier to take out the light from a side surface of the transparent substrate.

Light beams emitted upward from the fluorescent substance in the adhesive layer reach the side surface of transparent substrate or an upper portion of semiconductor light emitting element, depending on their output angles. Here, light beams having longer wavelength than the light emitted from semiconductor light emitting element are prevented from being re-absorbed by the semiconductor light emitting element. Since the light beams emitted from the fluorescent substance have the wavelength converted to longer side, the light beams are not much re-absorbed by the semiconductor light emitting element even when they reach the upper part of the semiconductor light emitting element. Since the adhesive layer contains fluorescent substance, extraction of light from the side surface of transparent substrate becomes easier and re-absorption in the semiconductor light emitting element is reduced. Thus, the efficiency of extracting light to the outside can be improved.

Further, since the thickness of adhesive layer is made equal to or smaller than the average particle diameter of fluorescent substance contained in the sealing member, excessive increase in the thickness of adhesive layer can be prevented. This prevents decreased heat radiation resulting from excessively thick adhesive layer. As a result, reduction in light emission efficiency caused by lower heat radiation can be prevented, and a semiconductor light emitting device having high illuminance can be provided.

Preferably, average particle diameter of the fluorescent substance contained in the adhesive layer is at most 200 nm.

Since the average particle diameter of fluorescent substance contained in the adhesive layer is set to be equal to or smaller than 200 nm, it is easy to make the thickness of adhesive layer to be the same or smaller than the average particle diameter of fluorescent substance contained in the sealing member. Thus, reduction in light emission efficiency caused by lower heat radiation can be prevented.

Here, preferably, average particle diameter of the fluorescent substance contained in the adhesive layer is at most 100 nm.

Since the average particle diameter of fluorescent substance contained in the adhesive layer is set to be equal to or smaller than 100 nm, reduction in light emission efficiency caused by lower heat radiation can more easily be prevented.

More preferably, the substrate has a light reflecting surface, and the semiconductor light emitting element is mounted on the light reflecting surface.

Since the semiconductor light emitting element is mounted on a light reflecting surface of the substrate, the light beams emitted downward (to the substrate side) from the fluorescent substance in the adhesive layer are reflected upward (to the side of semiconductor light emitting element) from the light reflecting surface. Further, light beams not entered the fluorescent substance in the adhesive layer but reached the light reflecting surface of the substrate can also be reflected upward (to the side of semiconductor light emitting element) from the light reflecting surface. The light reflected from the light reflecting surface can be extracted from the side surface of transparent substrate and from the upper surface of semiconductor light emitting element. Thus, the efficiency of extracting light to the outside can further be improved.

More preferably, the fluorescent substance contained in the adhesive layer emits fluorescent light having longer emission wavelength than the fluorescent substance contained in the sealing member.

The adhesive layer contains fluorescent substance that emits fluorescent light of longer wavelength than the fluorescent substance contained in the sealing member. Therefore, it becomes possible to prevent the light emitted from the fluorescent substance (fluorescent light) in the adhesive layer from being absorbed by the fluorescent substance contained in the sealing member. Thus, the efficiency of extracting light to the outside can further be improved.

Preferably, the transparent substrate is any of a sapphire substrate, a nitride-based semiconductor substrate and a SiC substrate.

More preferably, the adhesive layer is formed of silicone resin.

Silicone resin passes the light emitted from the semiconductor light emitting element with high light-transmittance. By using silicone resin as the adhesive layer, it becomes possible to efficiently convert the wavelength of light by the fluorescent substance in the adhesive layer. Thus, light can more easily be extracted from the side surface of transparent substrate.

From the foregoing, it is understood that a semiconductor light emitting device capable of improving the efficiency of extracting light to the outside can easily be obtained by the present invention.

BRIEF DESCRIPTION OF THE DRAWINGS

FIG. 3 shows reflectance of metal materials.

DETAILED DESCRIPTION OF THE INVENTION

Figure 1:
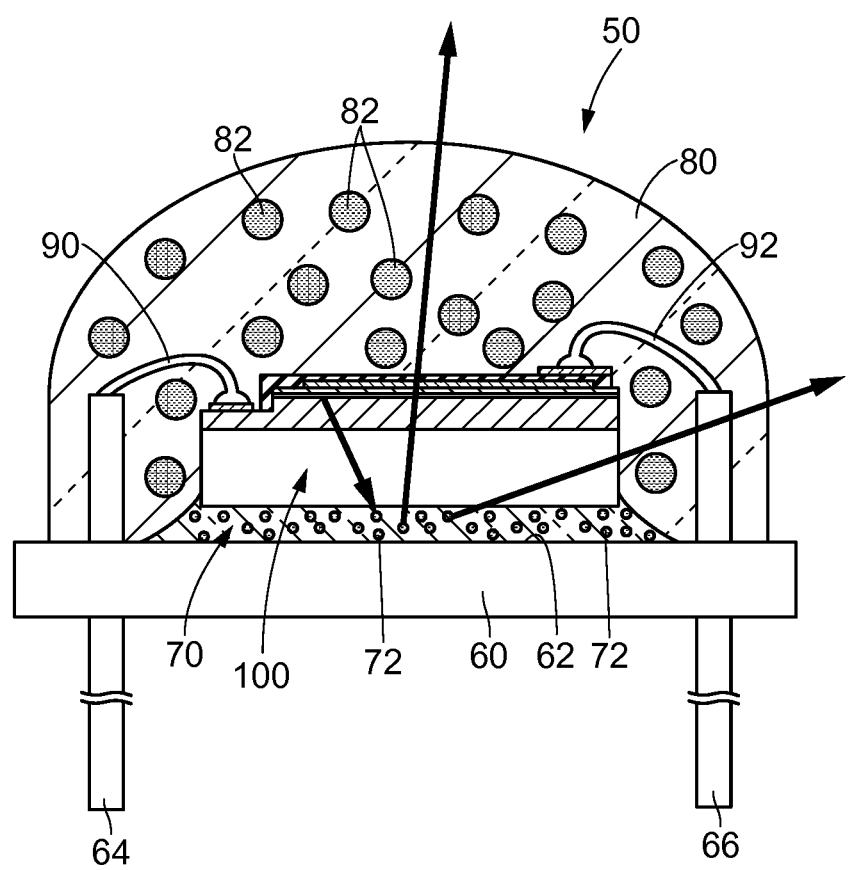
FIG. 1 is a cross-sectional view schematically showing a semiconductor light emitting device in accordance with a first embodiment of the present invention.

In the following, embodiments implementing the present invention will be described in detail with reference to the figures. In the following description and in the drawings, the same parts or components are denoted by the same reference characters and same names. They also have similar functions. Therefore, detailed description thereof will not be repeated.

Referring to FIG. 1, a semiconductor light emitting device 50 in accordance with the present invention includes a semiconductor light emitting element 100 as a light source, a reflective substrate 60 (package base body) on which semiconductor light emitting element 100 is mounted (packaged), and a sealing member 80 formed on that surface of reflective substrate 60 on which semiconductor light emitting element 100 is mounted, for sealing semiconductor light emitting element 100.

Semiconductor light emitting element 100 is formed of a light emitting diode (LED) chip formed by using a nitride semiconductor.

Reflective substrate 60 is formed, for example, of a metal core substrate. A metal core substrate is formed of a copper based metal substrate, with Ag plating or the like provided on its surface to increase reflectance. Reflective substrate 60 has a light reflecting surface 62 reflecting light emitted from semiconductor light emitting element 100. In the metal core substrate, the surface having Ag plating or the like serves as the light reflecting surface 62. On light reflecting surface 62, the above-described semiconductor light emitting element 100 is fixed by means of an adhesive layer 70. Adhesive layer 70 is formed of a die bonding paste. Fluorescent substance 72 is dispersed in adhesive layer 70.

Further, two lead terminals 64 and 66 are attached to reflective substrate 60. These lead terminals 64 and 66 are attached to penetrate reflective substrate 60 in the thickness direction and, therefore, each of the terminals has one end protruded to the side on which semiconductor light emitting element 100 is mounted. Lead terminals 64 and 66 are fixed insulated from reflective substrate 60. Lead terminals 64 and 66 are electrically connected to semiconductor light emitting element 100, respectively through wires 90 and 92 of gold, for example, at portions protruded to the side of the surface on which semiconductor light emitting element 100 is mounted.

Sealing member 80 is formed of a light transmitting, transparent resin and formed to seal semiconductor light emitting element 100 on light reflecting surface 62 of reflective substrate 60. Fluorescent substance 82 that is excited by light from semiconductor light emitting element 100 and emits fluorescent light is dispersed in sealing member 80.

Figure 2:
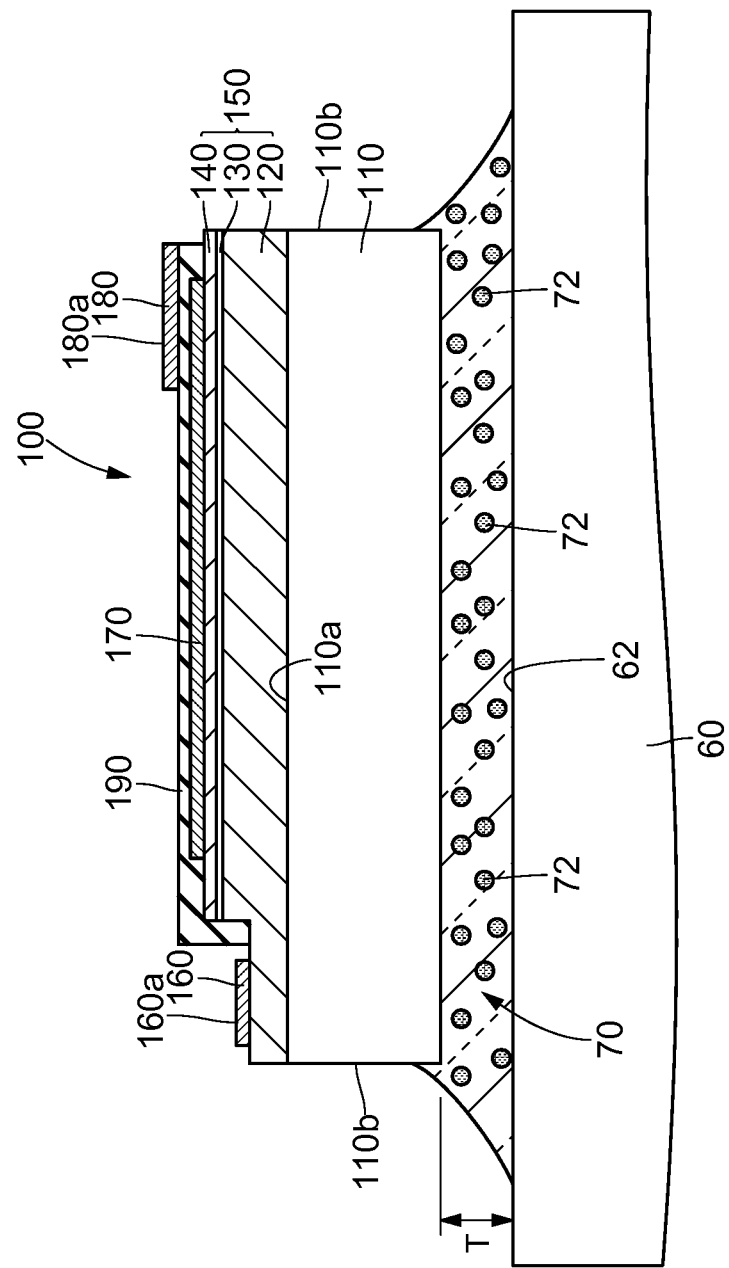
FIG. 2 is a cross-sectional view of a semiconductor light emitting element mounted on the semiconductor light emitting device shown in FIG. 1.

Referring to FIG. 2, semiconductor light emitting element 100 includes a transparent substrate 110 having light transmittance to the light emitted from itself. Transparent substrate 110 has a main surface 110a and a side surface 110b. In the present embodiment, a sapphire substrate is used as transparent substrate 110. Thickness of transparent substrate 110 is, for example, 120 µm. On main surface 110a of transparent substrate 110, a multi-layered structure 150 including a multi-layered semiconductor film is formed. Multi-layered structure 150 includes an n-type layer 120, an MQW light emitting layer 130 having an MQW (Multiple Quantum Well) structure, and a p-type layer 140 formed in this order from the side of transparent substrate 110.

The n-type layer 120 is provided on main surface 110a of transparent substrate 110, constituted by a buffer layer, an underlying layer, an n-type nitride semiconductor layer, a low-temperature n-type GaN/InGaN multi-layered structure and a super-lattice layer as an intermediate layer (all not shown) formed in this order from the side of main surface 110a. In the present specification, the super-lattice layer means a layer having very thin crystal layers stacked with each other so as to have a periodic structure of crystal lattice longer than the primitive unit lattice. The p-type layer 140 is constituted by a p-type AlGaN layer, a p-type GaN layer and a high-concentration p-type GaN layer (all not shown) formed in this order from the side of MQW light emitting layer 130, on MQW light emitting layer 130.

The buffer layer is formed, for example, of $Al_{s0}Ga_{t0}N$ ($0 \le s0 \le 1$, $0 \le t0 \le 1$, $s0+t0 \ne 0$). Preferably, the buffer layer is formed of an AN layer or a GaN layer. Only a small part (for example, about 0.5% to about 2%) of N (nitrogen) may be replaced by O (oxygen). By this approach, the buffer layer comes to be formed to extend along the normal direction of main surface 110a of transparent substrate 110 and, therefore, a buffer layer formed of a set of columnar crystals with uniform crystal grains can be obtained. Though not specifically limiting, the thickness of buffer layer is preferably at least 3 nm and at most 100 nm, and more preferably, at least 5 nm and at most 50 nm.

The underlying layer is formed, for example, of $Al_{s1}Ga_{t1}In_{u1}N$ ($0 \le s1 \le 1$, $0 \le t1 \le 1$, $0 \le u1 \le 1$, $s1+t1+u1 \ne 0$). Preferably, the underlying layer is formed of $Al_{s1}Ga_{t1}N$ ($0 \le s1 \le 1$, $0 \le t1$, $s1+t1 \ne 1$) and, more preferably, it is formed of a GaN layer. Preferable thickness of underlying layer is at least 1 µm and at most 8 µm.

The n-type nitride semiconductor layer is formed, for example, of $Al_{s2}Ga_{t2}In_{u2}N$ ($0 \le s2 \le 1$, $0 \le t2 \le 1$, $0 \le u2 \le 1$, $s2+t2+u2 \approx 1$), doped with an n-type impurity. More preferably, the n-type nitride semiconductor layer is formed, for example, of $Al_{s2}Ga_{(1-s2)}N$ ($0 \le s2 \le 1$, preferably, $0 \le s2 \le 0.5$, more preferably, $0 \le s2 \le 0.1$), doped with an n-type impurity. As the n-type impurity, Si is used. Though not specifically limited, the n-type doping concentration (different from carrier concentration) is preferably at most $1 \times 10^{19}$ cm$^{-3}$.

The low-temperature n-type GaN/InGaN multi-layered structure has a function of relaxing stress to MQW light emitting layer 130 from transparent substrate 110 and the underlying layer. The low-temperature n-type GaN/InGaN multi-layered structure is constituted by an n-type InGaN layer of about 7 nm in thickness, an n-type GaN layer of about 30 nm in thickness, an n-type InGaN layer of about 7 nm in thickness and an n-type GaN layer of about 20 nm in thickness stacked on each other.

The super-lattice layer (intermediate layer) has a super-lattice structure having wide-gap and narrow-gap layers stacked one after another. The periodic structure thereof is longer than the primitive unit lattice of the semiconductor material forming the wide band gap layer and longer than the primitive unit lattice of the semiconductor material forming the narrow band gap layer. The length of one period of super-lattice layer (total thickness of the thickness of wide band gap layers and thickness of narrow band gap layers) is shorter than the length of one period of MQW light emitting layer 130. Specific thickness of super-lattice layer is, for example, at least 1 nm and at most 10 nm. Each wide band gap layer is formed, for example, of $Al_aGa_bIn_{(1-a-b)}N$ ($0≤a<1$, $0<b≤1$). Each wide band gap layer is preferably formed of a GaN layer. Each narrow band gap layer is preferably formed of a semiconductor material having a band gap smaller than the wide band gap layer and larger than each well layer (not shown) of MQW light emitting layer 130. Each narrow band gap layer is formed, for example, of $Al_aGa_bIn_{(1-a-b)}N$ ($0≤a<1$, $0<b≤1$). Preferably, each narrow band gap layer is formed of $Ga_bIn_{(1-b)}N$ ($0<b≤1$). If the wide band gap layer and the narrow band gap layer are both undoped, driving voltage increases. Therefore, it is preferred that at least one of the wide band gap layer and the narrow band gap layer is doped with an n-type impurity.

MQW light emitting layer 130 has a multi-quantum well structure having barrier layers and well layers (both not shown) stacked one after another. The length of one period (total thickness of barrier layer thickness and well layer thickness) of MQW light emitting layer 130 is, for example, at least 5 nm and at most 100 nm. The composition of each well layer is adjusted in accordance with the wavelength of light required of the semiconductor light emitting element. By way of example, the composition of each well layer may be $Al_cGa_dIn_{(1-c-d)}N$ ($0≤c<1$, $0<d≤1$). It is preferred that the composition of each well layer is $In_eGa_{(1-e)}N$ ($0<e≤1$), not including Al. Preferably, each well layer has the same composition. In that case, the light emitted by re-combination of electrons and holes come to have the same wavelength in each well layer. This is preferred since it enables narrowing of light emission spectrum of the semiconductor light emitting device. Preferable thickness of each well layer is at least 1 nm and at most 7 nm.

Each barrier layer preferably has a band gap energy larger than each well layer. The composition of each barrier layer may be $Al_fGa_gIn_{(1-f-g)}N$ ($0≤f<1$, $0<g≤1$). More preferably, the composition of each barrier layer is $In_hGa_{(1-h)}N$ ($0<h≤1$) not containing Al, or $Al_fGa_gIn_{(1-f-g)}N$ ($0≤f<1$, $0<g≤1$) with the lattice constant made substantially the same as that of well layer. As to the thickness of each barrier layer, if the thickness becomes smaller, the driving voltage lowers, while the light emitting efficiency lowers if the thickness is too small. Therefore, preferable thickness of each barrier layer is at least 1 nm and at most 10 nm and, more preferably, at least 3 nm and at most 7 nm.

The well layer and the barrier layer are doped with n-type impurities. It is noted, however, that the well layer and the barrier layer may not be doped with n-type impurities.

The p-type layer 140 is formed, for example, of $Al_{s4}Ga_{t4}In_{u4}N$ ($0≤s4≤1$, $0≤t4≤1$, $0≤u4≤1$, $s4+t4+u4≠0$), doped with a p-type impurity. Preferably, the p-type layer 140 is formed of $Al_{s4}Ga_{(1-s4)}N$ ($0<s4≤0.4$, preferably, $0.1≤s4≤0.3$) doped with a p-type impurity. The carrier concentration of p-type layer 140 is preferably $1×10^{17}$ cm$^{-3}$ or higher. Here, activity rate of p-type impurity is approximately 0.01 and, therefore, preferable p-type doping concentration (different from the carrier concentration) of p-type layer 140 is at least $1×10^{19}$ cm$^{-3}$. Here, it is noted that the concentration of p-type doping may be lower than this in a layer closer to MQW light emitting layer 130 (for example, in p-type AlGaN layer). Though not specifically limited, the thickness of p-type layer 140 (total thickness of three layers) may be at least 50 nm and at most 1000 nm. If the p-type layer 140 is made thin, heating time for the growth thereof can be reduced and, hence, diffusion of p-type impurity to MQW light emitting layer 130 can be reduced.

The multi-layered structure 150 described above further includes an exposed portion where a part of n-type layer 120 is exposed, and a mesa portion as a region outside the exposed region.

On an upper surface of exposed portion (on n-type layer 120), an n-side electrode 160 is formed. The n-side electrode 160 includes a pad portion 160a as a wire bonding region, and an elongate protruding portion (branch electrode: not shown) aimed to diffuse current, formed integrally with pad portion 160a. A wire 90 is electrically connected to n-side electrode 160 (pad portion 160a). On an upper surface of mesa portion (on p-type layer 140), a p-side electrode 180 is formed, with a transparent electrode 170 interposed. The n-side and p-side electrodes 160 and 180 are electrodes for supplying driving power to semiconductor light emitting element 100.

Transparent electrode 170 is formed over a relatively large area on the mesa portion. The p-side electrode 180 is formed on a partial region of transparent electrode 170. The p-side electrode 180 includes a pad portion 180a as a wire bonding region, and an elongate protruding portion (branch electrode: not shown) aimed to diffuse current, formed integrally with pad portion 180a. A wire 92 is electrically connected to p-side electrode 180 (pad portion 180a).

The n-side electrode 160 has a multi-layered structure including, for example, a titanium layer, an aluminum layer and a gold layer stacked in this order on n-type layer 120. The thickness of n-side electrode 160 is, for example, about 1 μm. Considering the strength at the time of wire bonding, n-side electrode 160 may have a thickness of about 1 μm.

Transparent electrode 170 is formed, for example, of ITO (Indium Tin Oxide). Its thickness is, for example, at least 20 nm and at most 200 nm.

The p-side electrode 180 has a multi-layered structure including, for example, a nickel layer, an aluminum layer, a titanium layer and a gold layer, stacked in this order on transparent electrode 170. The thickness of p-side electrode 180 is, for example, about 1 μm. Again considering the strength at the time of wire bonding, p-side electrode 180 may also have a thickness of about 1 μm.

On the upper surface of semiconductor light emitting element 100, an insulating transparent protective film 190 of SiO$_2$ is formed. This transparent protective film 190 is formed to cover substantially the whole upper surface of semiconductor light emitting element 100. It is noted, however, that transparent protective film 190 is patterned to expose pad portion 180a of p-side electrode 180 and pad portion 160a of n-side electrode 160.

Adhesive layer 70 is formed of a die boding paste. The die bonding paste is formed of silicone resin, which is a thermosetting resin. The die bonding paste, when cured, fixes the semiconductor light emitting element 100 on reflective substrate 60. Adhesive layer 70 as such is transparent when it fixes semiconductor light emitting element 100 on reflective substrate 60, with the above-described fluorescent substance dispersed therein. The silicone resin forming adhesive layer 70 has high transmittance of light of short wavelength in the range of blue to ultraviolet. Therefore, if the light emitted from semiconductor light emitting element 100 has such a short wavelength, the wavelength of light can efficiently be converted by fluorescent substance 72 in adhesive layer 70.

As fluorescent substance 72 contained in adhesive layer 70, one having average particle diameter of at most 200 nm is used. The average particle diameter of fluorescent substance 72 is preferably at most 100 nm, and more preferably, smaller than 100 nm. The lower limit of average particle diameter of adhesive layer 70 is larger than 0, and it may be the minimum value that can possibly be manufactured. In the present specification, the "average particle diameter" refers to the particle diameter at an integrated value of 50% in particle distribution as is measured by laser diffraction scattering method (average particle diameter d50).

The thickness T of adhesive layer 70 is, for example, about 2 μm to about 6 μm. As will be described later, fluorescent substance 82 scattered in sealing member 80 has the average particle diameter of about 2 μm to about 6 μm. Therefore, the thickness T of adhesive layer 70 is made to be the same or smaller than the average particle diameter of fluorescent substance 82 scattered in sealing member 80.

Here, the resin material such as silicone resin used as the die bonding paste generally has very high heat resistance. Therefore, when the thickness of adhesive layer increases, heat radiating characteristic of semiconductor light emitting element 100 abruptly decreases. If the fluorescent substance having the average particle diameter of comparative size as fluorescent substance 82 dispersed in sealing member 80 is used as the fluorescent substance dispersed in adhesive layer 70, adhesive layer 70 becomes too thick and the heat radiating characteristic of semiconductor light emitting element significantly decreases. Therefore, in the present embodiment, fluorescent substance 72 having average particle diameter smaller than fluorescent substance 82 dispersed in sealing member 80 is dispersed in adhesive layer 70, whereby the thickness T of adhesive layer 70 is made equal to or smaller than the average particle diameter of fluorescent substance 82 dispersed in sealing member 80. Thus, even when the fluorescent substance is dispersed in adhesive layer 70, adhesive layer 70 will not be too thick.

Considering the increase in heat resistance and the like, the content of fluorescent substance 72 is preferably about 0.5% to about 30% by weight and more preferably, about 0.5% to about 10%.

As the fluorescent substance having the average particle diameter of at most 200 nm, by way of example, nano fluorescent substance (nano-particle fluorescent substance) and fluorescent substance prepared by refining fluorescent substance used in the particle size of about 10 μm or by pulverizing such fluorescent substance to smaller particle size may be used.

Known materials including $ZnS:Mn^{2+}$ nano fluorescent substance, $ZnGa_2O_4:Mn^{2+}$ nano fluorescent substance, $YAG:Ce^{3+}$ nano particles, $LAPO_4:Ln$ nano fluorescent substance, dye-doped silica nano fluorescent substance, GaN nano pillar fluorescent substance, $TiO_2:Eu^{3+}$ microsphere fluorescent substance, $ZnS:Mn^{2+}/SiO_2$ nano fluorescent substance and CdSe—ZnS quantum dots may be used as the material of nano fluorescent substance.

YAG (Yttrium-Aluminum-Garnet) fluorescent substance commonly used in white LED emitting white light having the particle size of about 100 nm is currently available. Such fluorescent substance may be used as fluorescent substance 72 to be dispersed in adhesive layer 70.

Possible examples that may be used as fluorescent substance 72 contained in adhesive layer 70 include Ce:YAG (cerium-activated Yttrium-Aluminum-Garnet) fluorescent substance $(Y_3Al_5O_{12}:Ce$, $(Y, Gd)_3Al_5O_{12}:Ce$ etc.), Eu:BOSE (europium-activated Barium-Strontium-Ortho silicate) fluorescent substance, Eu:SOSE (europium-activated Strontium-Barium-Ortho silicate) fluorescent substance, europium-activated a sialon fluorescent substance, Ce:TAG (cerium-activated Terbium-Aluminum-Garnet) fluorescent substance $(Tb_3Al_5O_{12}:Ce$ etc.), alkali earths (Eu-activated $M_2Si_5N_8:Eu$, $MSi_{12}O_2N_2:Eu$ etc., Ce-activated $Ca_3Sc_2Si_3O_{12})$, CASN-Eu (Eu-activated $CaAlSiN_3$), La oxynitride-Ce Ce-activated $LaAl(Si_6-zAl_2)N_{10}-zO$, and β sialon.

Further, it is possible to use green fluorescent substances including $(Sr, Ba, Mg)_2SiO_4:Eu$ and $Ca_3(Sc, Mg)_2Si_3O_{12}$: Ce, red fluorescent substances including $(Sr, Ca)AlSiN_3:Eu$ and $CaAlSiN_3:Eu$, and yellow fluorescent substances including $(Si, Al)_6(O,N)_8:Eu$ and $(Ba, Sr)_2SiO_4:Eu$.

As described above, yellow, red and green fluorescent substances may be used as fluorescent substance 72 contained in adhesive layer 70. Here, the fluorescent substance may be consisted of any one of these fluorescent substances, or it may be a combination of a plurality of different types. By way of example, a combination of different types may be a combination of red and green fluorescent substances.

The above-described adhesive layer 70 may include a diffusing agent, in addition to fluorescent substance 72. Though not specifically limiting, barium titanate, titanium oxide, aluminum oxide, silicon oxide, calcium carbonate and silicon dioxide may be suitably used as the diffusing agent. As in the case of fluorescent substance 72, a diffusion agent having small average particle diameter is preferred.

It is noted that smaller average particle diameter of the fluorescent substance may possibly leads to lower light emission efficiency. Considering the decrease in light emission efficiency, it is preferred to use, as the fluorescent substance to be dispersed in adhesive layer 70, one having the average particle diameter comparable to that of fluorescent substance 82 dispersed in sealing member 80. Though fluorescent substance having smaller average particle diameter may lower the light emission efficiency, it allows introduction of a larger amount of fluorescent substance to adhesive layer 70. Therefore, decrease in light emission efficiency can be alleviated by filling adhesive layer 70 with a large amount of fluorescent substance. Further, even when adhesive layer 70 is filled with a large amount of fluorescent substance, if the fluorescent substance has small average particle diameter, the thickness of adhesive layer 70 is not much increased. Therefore, it is possible to prevent decrease in heat radiation characteristics while minimizing the decrease in light emission efficiency.

Sealing member 80 is formed of a light transmitting material. The material is not specifically limited provided that it transmits light, and sealing member 80 may be formed appropriately using any material conventionally well known in the field of art. Materials suitably used for forming sealing member 80 include light transmitting resin materials with superior weather resistance such as epoxy resin, urea resin and silicone resin, silica sol having superior light resistance, and transparent inorganic materials such as glass. In the present embodiment, silicone resin is used as a sealing material forming sealing member 80.

In sealing member 80, fluorescent substance 82 having the average particle diameter of about 6 μm to about 20 μm is dispersed. Fluorescent substance 82 contained in sealing member 80 may be formed of a material that can be used as fluorescent substance 72 contained in adhesive layer 70.

In the present embodiment, chromaticity and the like of semiconductor light emitting device 50 are not entirely determined by fluorescent substance 72 in adhesive layer 70, and the chromaticity and the like of semiconductor light emitting device 50 are mainly controlled by fluorescent substance 82 in sealing member 80. Therefore, the type of fluorescent substance 82 contained in sealing member 80 is determined based on the relation with fluorescent substance 72 contained in adhesive layer 70. By way of example, assume that the light emitted from semiconductor light emitting element 100 is blue light having the peak wavelength at 450 nm and adhesive layer 70 contains green fluorescent substance. Then, it is possible to use red fluorescent substance as fluorescent substance 82 of sealing member 80. Then, the light emitted from semiconductor light emitting device 50 becomes white. Alternatively, fluorescent substance 72 contained in adhesive layer 70 and fluorescent substance 82 contained in sealing member 80 may both be yellow fluorescent substance. Then, the blue light emitted from semiconductor light emitting element 100 and yellow light emitted from the fluorescent substance excited by the light from semiconductor light emitting element 100 are mixed, resulting in white light.

Figure 6:
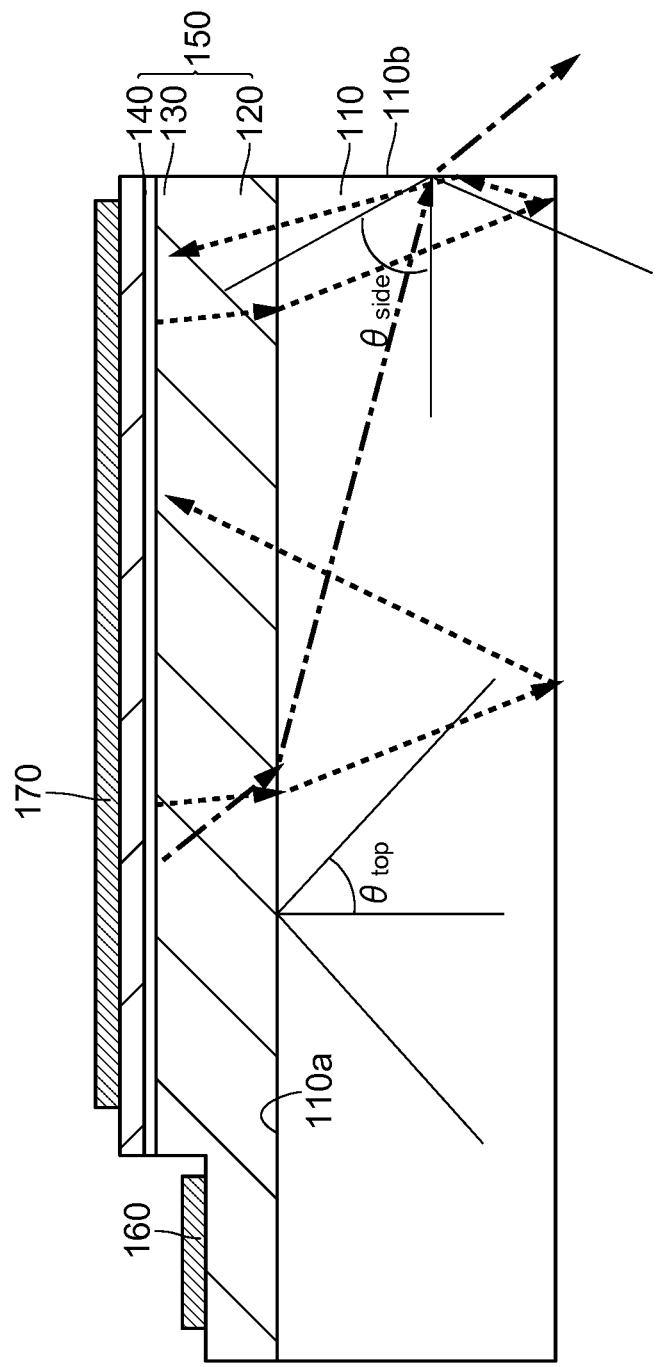
FIG. 6 illustrates optical paths of light beams emitted from the semiconductor light emitting element.

Referring to FIG. 6, if the adhesive layer does not contain any fluorescent substance, the light emitted downward from the active layer (light emitting layer 130) enters the transparent substrate (sapphire substrate) 110, reflected from the back surface of the substrate and returns upward (to the upper surface) of transparent substrate 110. Further, part of the light that entered transparent substrate 110 is directed to the side surface 110b of transparent substrate 110.

The semiconductor light emitting element is typically sealed with a transparent resin (sealing member) having the refractive index of about 1.4 to about 1.5. By way of example, when the semiconductor light emitting element is sealed with a transparent resin having the refractive index of 1.5, at an interface between the side surface 110b of transparent substrate 110 (refractive index of sapphire=1.78) and the transparent resin, the angle of total reflection will be $\theta_{side} \geq 57.43°$. Specifically, assuming that minor reflection occurs at the back surface of transparent substrate 110, the light entering from the upper surface of transparent substrate 110 at an angle of $0° \leq \theta_{top \leq 32.57}°$ will not be taken out from the side surface 110b of transparent substrate 110 but returns to multi-layered structure 150 formed on transparent substrate 110.

On the other hand, the light having the incident angle of $\theta_{top > 32.57}°$ is divided to light directed to the side surface 110b of transparent substrate 110 (see chain-dotted arrows) and light returned to multi-layered structure 150, depending on the position where the light enters transparent substrate 110. Here, the light directed to the side surface 110b of transparent substrate 110 is taken out to the outside from the side surface 110b of transparent substrate 110.

If the back surface of transparent substrate 110 is a minor-surface, the light having the incident angle of $0° \leq \theta_{top \leq 32.57}°$ is not at all taken out from transparent substrate 110, but enters the adhesive layer (not shown) from the bottom surface of transparent substrate 110, reflected by the reflective substrate (not shown), directed to transparent substrate 110 and returns to multi-layered structure 150 (see dotted arrows). Part of the light that has returned to multi-layered structure 150 is taken to the outside of the chip (outside of the light emitting element), and part is absorbed by various light absorbing bodies such as transparent electrode 170, p-side electrode 180 and active layer (re-absorption by light emitting layer 130).

Referring to FIGS. 1 and 2, in the present embodiment in which adhesive layer 70 contains fluorescent substance 72, the light emitted from semiconductor light emitting element 100 has its wavelength converted by fluorescent substance 72 and its angle of reflection changed by fluorescent substance 72. In the following, description will be given assuming that the light emitted from semiconductor light emitting element is blue light having the peak wavelength at 450 nm.

Of the light beams emitted from semiconductor light emitting element 100 and entered transparent substrate 110, those having the incident angle of $0° \leq \theta_{top \leq 32.57}°$ are not totally reflected at the interface between transparent substrate 110/adhesive layer 70 at the bottom surface of transparent substrate 110 and almost fully enter adhesive layer 70. Though some are reflected at the interface because of Fresnel reflection, the reflectance is relatively low and it is 0.73% with the incident angle of 0° and 0.91% with the incident angle of 32°.

Since adhesive layer 70 contains fluorescent substance 72, the light that has entered adhesive layer 70 has its wavelength converted by fluorescent substance 72. Fluorescent substance in adhesive layer 70 is excited by the light emitted from semiconductor light emitting element 100 and emits fluorescent light having longer wavelength than the emitted light (for example, it emits red light having the wavelength of 635 nm, green light having the wavelength of 530 nm or the like). The light emitted upward from fluorescent substance 72 is directed upward not using reflective substrate 60 below adhesive layer 70 and, depending on the output angle, directed upward or to the side surface 110b of transparent substrate 110. The light emitted downward from fluorescent substance 72 is reflected by reflective substrate 60 and directed upward or to the side surface 110b of transparent substrate 110.

Sealing member 80 (silicone resin) sealing semiconductor light emitting element 100 has the refractive index of 1.5 and, therefore, the light entering at an angle of 57.4° or smaller to the normal of side surface 110b of transparent substrate 110 comes to be emitted to the outside from the side surface 110b of transparent substrate 110. Therefore, that light can be taken out to semiconductor light emitting element 100 without any loss of absorption caused by transparent electrode 170 (ITO) and the like.

The light having the same wavelength (450 nm) as the light emitted from semiconductor light emitting element 100 suffers from loss caused by re-absorption by active layer (light emitting layer 130) when it returns to the upper portion of light emitting element 100. On the contrary, in the present embodiment, the light emitted from semiconductor light emitting element 100 has its wavelength converted to the longer wavelength side by fluorescent substance 72 in adhesive layer 70 and, therefore, re-absorption by active layer (light emitting layer 130) can be reduced, and light extracting efficiency can effectively improved.

Referring to FIG. 3, metal material such as silver (Ag), gold (Au) and rhodium forming the reflecting film and the like tends to have higher reflectance to light having longer wavelength. Specifically, wavelength dispersion of reflectance of Ag is as follows: 96.6% to the light having the wavelength of 450 nm; 97.9% to the light having the wavelength of 550 nm; and 98.3% to the light having the wavelength of 650 nm. Thus, the light reflectance tends to be higher as the wavelength becomes longer. As to Au used at the surface of an electrode, used as a wire or used for ball bonding, the reflectance is 38.7% to the light having the wavelength of 450 nm, 81.7% to the light having the wavelength of 550 nm and 95.5% to the light having the wavelength of 650 nm, and the light reflectance tends to be abruptly higher as the wavelength becomes longer. Further, rhodium used for a reflecting film of an electrode or the like also tends to have higher light reflectance to light having longer wavelength.

In the present embodiment, reflective substrate 60 has its surface plated with Ag. Further, a gold wire is used as wires 90 and 92 electrically connecting semiconductor light emitting element 100 to lead terminals 64 and 66. Namely, in semiconductor light emitting device 50, metals having higher reflectance to light of longer wavelength are used in considerable amount. Therefore, it follows that the light emitted from semiconductor light emitting element 100 should be converted to light of longer wavelength as quickly as possible, since reflectance at these metals becomes higher and hence the light extracting efficiency can be improved. The light entering adhesive layer 70 is converted to the side of longer wavelength, for example, to green or red light before it is reflected by Ag (light reflecting surface 62) of reflective substrate 60 and, hence, the light can be reflected with higher reflectance, advantageously resulting in smaller loss. Thus, by converting the wavelength by fluorescent substance 72 in adhesive layer 70, the light extracting efficiency can more effectively be improved.

Further, the excited light (the light emitted from semiconductor light emitting element 100) absorbed by fluorescent substance 72 contained in adhesive layer 70 is absorbed by fluorescent substance 72 and emitted again as fluorescent light. Here, the direction of progress of the light can be changed significantly before and after the emission. Therefore, the light entering transparent substrate 110 at the incident angle of $0° \leq \theta_{top} \leq 32.57°$ has its angle significantly changed as it is absorbed by fluorescent substance 72. As a result, it becomes easier to have the light emitted from the side surface 110b of transparent substrate 110 to sealing member 80. Thus, by fluorescent substance 72 contained in adhesive layer 70, the direction of travel of the light is changed and extraction of light from side surface 110b of transparent substrate 110 is made easier. This also leads to improved efficiency of light extraction.

The light emitted from semiconductor light emitting element 100 is spontaneously emitted light and it spreads out as it goes away from the element. Therefore, if the light is to be incident on a fluorescent substance far from the element, a large amount of fluorescent substance is necessary. By arranging the fluorescent substance such that the light reaches the fluorescent substance as close as possible to the light emitting point (the position of semiconductor light emitting element 100), it becomes possible to have the light emitted from the element be incident efficiently on the fluorescent substance of a small amount. For this purpose, fluorescent substance 72 is introduced to adhesive layer 70 immediately below semiconductor light emitting element 100, so that the fluorescent substance 72 comes very close to the light emitting point. In addition, since a considerable amount of light is emitted from the back surface of transparent substrate 110, it becomes possible to have the light emitted from semiconductor light emitting element 100 to be incident on fluorescent substance 72 very efficiently by introducing fluorescent substance 72 to adhesive layer 70. As a result, wavelength conversion can be attained with higher efficiency by the fluorescent substance 72 in adhesive layer 70.

Referring to FIGS. 1 and 2, the method of manufacturing semiconductor light emitting device 50 in accordance with the preset embodiment will be described.

A transparent substrate of sapphire of about 400 µm to about 1300 µm in thickness is prepared. The main surface (the surface on which a nitride semiconductor layer is formed) of the transparent substrate is mirror-polished to a minor surface (to have the surface roughness Ra of about 1 nm or smaller).

Next, by using a vapor phase growth process such as MOCVD (Metal Organic Chemical Vapor Deposition), HVPE (Hydride Vapor Phase Epitaxy) and MBE (Molecular Beam Epitaxy), a multi-layered film of nitride semiconductor is formed on the main surface of transparent substrate. Specifically, referring to FIG. 2, on the main surface of transparent substrate, an n-type layer 120 consisting of a buffer layer, an underlying layer, an n-type nitride semiconductor layer, a low-temperature n-type GaN/InGaN multi-layered structure and a super-lattice layer, an MQW light emitting layer 130, and a p-type layer 140 are formed in this order. Thus, a multi-layered structure 150 including a multi-layered film is formed on the transparent substrate. Thereafter, p-type layer 140, MQW light emitting layer and n-type layer 120 are partially etched to expose a part of n-type layer 120. On an upper surface of n-type layer 120 exposed by this etching, an n-side electrode 160 is formed. Further, on an upper surface of p-type layer 140, a transparent electrode 170 and a p-side electrode 180 are formed in this order. Thereafter, a transparent protective film 190 is formed to cover transparent electrode 170 and side surfaces of these layers exposed by the etching.

Next, the substrate with the electrodes formed is subjected to heat treatment, so that the electrodes are alloyed. This realizes satisfactory ohmic contact between the electrodes and the semiconductor layer and lowers contact resistance between the electrodes and the semiconductor layer. The temperature of heat treatment is preferably in the range of 200° C. to 1200° C., more preferably in the range of 300° C. to 900° C. and, further preferably, in the range of 450° C. to 650° C. As to other conditions of heat treatment, atmospheric gas should contain at least one of oxygen and nitrogen. It is also possible to conduct heat treatment in an atmosphere containing an inert gas such as Ar, or under atmospheric conditions.

Next, the wafer fabricated through the steps described above is ground and polished to reduce the thickness of transparent substrate. Specifically, the wafer is set in a grinder and the back surface of the substrate (on which the semiconductor layer is not formed) is ground until the substrate thickness reaches about 160 µm. Next, the wafer is set in a polisher and the back surface of the substrate is polished with the count of abrasive agent changed stepwise to smaller ones until the back surface of substrate is made a minor surface (optical minor surface), and the substrate thickness is reduced to 120 µm. The substrate is minor-finished in this manner, because any unevenness on the substrate surface may cause irregular cleavage and chipping, as the stress at the time of scribing (dicing) tends to be dispersed more easily. Preferably, the surface of the back surface after mirror-polishing has root-mean-square roughness Rq (old RMS) of at most 10 nm.

The substrate thickness is preferably in the range of 20 µm to 50 µm, and more preferably in the range of 80 µm to 300 µm. With the substrate thickness within this range, it is possible to easily divide the substrate in an intended direction.

Thereafter, break lines (not shown) for chip dicing are formed in transparent substrate 110. The break lines are formed for dicing of chips (semiconductor light emitting elements) to a prescribed size, as straight lines in transparent substrate 110. Preferably, the break lines are formed by laser beam irradiation. Particularly, it is preferred to form the lines by irradiation with a laser beam that is transmitted through sapphire. Here, transmitted means that the transmittance is 70% or higher immediately after the transparent substrate 110 (sapphire substrate) is irradiated with the laser beam, or in the state in which the properties of sapphire are not yet changed. The transmittance of 80% or higher is preferable and 90% or higher is more preferable.

Though laser beam irradiation for forming break lines may be done from the side on which the nitride semiconductor is formed (the side on which multi-layered structure 150 is formed), considering absorption by the nitride semiconductor, irradiation from the back surface side of transparent substrate 110 (the side on which multi-layered structure 150 is not formed) is preferred. By directing the laser beam from the back surface side of transparent substrate 110, influence to the active layer and the like can be reduced.

Finally, using thus formed break lines as starting points, the wafer is divided into individual chips (semiconductor light emitting elements). Thus, semiconductor light emitting element 100 is obtained.

Semiconductor light emitting element 100 obtained in the above-described manner is mounted (fixed) on reflective substrate 60 (package base) using a die bonding paste.

A light transmitting silicone resin kneaded with a fluorescent substance is used as the die bonding paste. The average particle diameter of fluorescent substance is 200 nm or smaller. As such a fluorescent substance, nano fluorescent substance (nano-particles fluorescent substance) having the average particle diameter of 100 nm or smaller may be used, or fluorescent substrate prepared by refining a fluorescent substance currently used with the particle diameter of about 10 µm or by pulverizing such a fluorescent substance to smaller particle diameter may be used.

As to the method of synthesizing nano fluorescent substance, by way of example, the following methods may be used.

1. Sol-gel method (polymerized complex method)

Synthesis of $YVO_4:Eu^{3+}$ by polymerized complex method

Synthesis of $YNbO_4:Eu^{+3}$ by PVA method

Synthesis of $Y_2O_2S:Eu^{+3}$ by complex homogeneous precipitation method

2. Inverse micelle method and colloid deposition

Formation of CdS nano by colloid deposition.

3. Hot soap method, super critical hydrothermal method, solvethermal method (synthesis of rare-earth aluminum garnet, synthesis of composite oxide, $Zn_2SiO_4:Mn^{2+}$ nano fluorescent substance, $LaPO_4:Ce^{3+}$, $Tb^{3+}$ nano fluorescent substance), spray pyrolysis method, glycothermal method (oxide nano fluorescent substance such as $Y_3Al_5O_{12}:Ce^{3+}$ (YAG:$Ce^{3+}$), $MgGa_2O_4:Mn^{2+}$, $ZnGa_2O_4:Mn^{2+}$), nano fluorescent substance such as $Y_2O_3:Bi^{3+}$, $Eu^{3+}$ by polyol method.

The nano fluorescent substance may be synthesized or formed by various methods as mentioned above, and any method may be used without causing any problem.

An appropriate amount of the die bonding paste as such is applied to light reflecting surface 62 of reflective substrate 60, and semiconductor light emitting element 100 is die-bonded. Thereafter, by heating in an oven at 150° C. for three hours, the die bonding paste is cured. Thus, adhesive layer 70 containing fluorescent substance 72 is formed, and with this adhesive layer 70 interposed, semiconductor light emitting element 100 is fixed on reflective substrate 60. Adhesive layer 70 is formed, for example, to the thickness of about 2 µm to about 6 µm.

The thickness of adhesive layer is typically about 2 µm to about 6 µm when a die bonding paste not containing any fluorescent substance is used. When the particle diameter of fluorescent substance introduced to the die bonding paste increases, the thickness of die bonding paste (adhesive layer) tends to be increased when semiconductor light emitting element 100 is fixed. By way of example, the average particle diameter of fluorescent substance generally used in white LED is as large as about 10 µm to 20 µm. When a fluorescent substance having a large particle diameter is used, the thickness of die bonding paste (adhesive layer) comes to be very large, to about 20 µm to about 40 µm. Since die bonding paste has very low heat conductivity, heat radiation characteristic significantly decreases as the thickness of adhesive layer increases.

On the other hand, by introducing a fluorescent substance of which average particle diameter is at most 200 nm, increase in thickness T of adhesive layer 70 can be prevented. Therefore, it is possible to have the thickness T of adhesive layer 70 comparable to that of the adhesive layer formed by a die bonding paste not containing any fluorescent substance.

Next, referring to FIG. 1, semiconductor light emitting element 100 fixed on reflective substrate 60 is electrically connected to lead terminals 64 and 66 through wires 90 and 92.

Semiconductor light emitting element 100 mounted on reflective substrate 60 is sealed by sealing member 80. A light transmitting silicone resin kneaded with fluorescent substance 72 is used as sealing member 80. Average particle diameter of fluorescent substance 72 is about 6 µm to about 20 µm.

By the silicone resin containing fluorescent substance 72, semiconductor light emitting element 100, wires 90 and 92, and part of lead terminals 64 and 66 are sealed, and then by heating in an oven for 3 hours at 150° C., the silicone resin is cured. Thus, sealing member 80 is formed and by this sealing member 80, semiconductor light emitting element 100 is sealed.

In the above-described manner, semiconductor light emitting device 50 in accordance with the present embodiment is manufactured.

As is apparent from the description above, semiconductor light emitting device 50 in accordance with the present embodiment attains the following effects.

Semiconductor light emitting element 100 including transparent substrate 110 is fixed on reflective substrate 60 by means of light-transmitting adhesive layer 70. The light emitted downward from semiconductor light emitting element 100 passes through transparent substrate 110 and enters adhesive layer 70. Since adhesive layer 70 contains fluorescent substance 72, the light from semiconductor light emitting element 100 is once absorbed by fluorescent substance 72 and it is converted to light of longer wavelength. The light with the wavelength thus converted is emitted as fluorescent light from fluorescent substance 72. Further, by fluorescent substance 72 contained in adhesive layer, the direction of light reflection (direction in which the fluorescent light is emitted) is changed and, hence, it becomes easier to extract light from side surface 110b of transparent substrate 110.

The light emitted upward from fluorescent substance 72 in adhesive layer 70 reaches side surface 110b of transparent substrate 110 or an upper portion of semiconductor light emitting element 100 depending on its output angle. Here, the light having longer wavelength than the light emitted from semiconductor light emitting element 100 is prevented from being re-absorbed by semiconductor light emitting element 100. Since the light emitted from fluorescent substance 72 has its wavelength converted to longer side, re-absorption thereof by semiconductor light emitting element 100 is reduced even when it reaches the upper portion of semiconductor light emitting element 100. In this manner, fluorescent substance 72 contained in adhesive layer 70 has the function of converting the wavelength of light emitted from semiconductor light emitting element 100 and the function of scattering the light emitted from semiconductor light emitting element 100. Therefore, by introducing fluorescent substance 72 to adhesive layer 70, extraction of light from side surface 110b of transparent substrate 110 becomes easier and, as the re-absorption by semiconductor light emitting element 100 is reduced, the efficiency of extracting light to the outside can be improved.

As described above, the die bonding paste has very poor heat conductivity. Therefore, if the thickness T of adhesive layer 70 becomes too thick, the heat radiation characteristic degrades and the light emission efficiency lowers. When a fluorescent substance having an average particle diameter comparable to that of fluorescent substance 82 contained in sealing member 80 is contained in the adhesive layer, the thickness of adhesive layer becomes too large as the average particle diameter of fluorescent substance 82 is large and, as a result, the heat radiation characteristic lowers significantly.

By introducing fluorescent substance 72 having average particle diameter smaller than that of fluorescent substance 82 contained in sealing member 80, it becomes possible to make the thickness of adhesive layer 70 equal to or smaller than the average particle diameter of fluorescent substance 82 contained in sealing member 80. This prevents adhesive layer 70 from becoming too thick and, hence, prevents degradation of heat radiating characteristic caused by adhesive layer 70 becoming too thick. As a result, lowering of light emission efficiency resulting from lower heat radiation characteristic can be prevented, and thus, semiconductor light emitting device 50 having high illuminance can be obtained.

When the average particle diameter of fluorescent substance 72 contained in adhesive layer 70 is 200 nm or smaller, the thickness T of adhesive layer 70 can easily be made equal to or smaller than the average particle diameter of fluorescent substance 82 contained in sealing member 80. Thus, decrease in light emission efficiency caused by the lowering of heat radiation characteristic can be prevented.

When the average particle diameter of fluorescent substance 72 contained in adhesive layer 70 is 100 nm or smaller, decrease in light emission efficiency caused by the lowering of heat radiation characteristic can more easily be prevented. The average particle diameter of fluorescent substance 72 smaller than 100 nm is more preferable.

Further, as semiconductor light emitting element 100 is mounted on light reflecting surface 62 of reflective substrate 60, the light emitted downward (to the substrate side) from fluorescent substance 72 in adhesive layer 70 is reflected upward (to the side of semiconductor light emitting element 100) by light reflecting surface 62. Further, light not incident on fluorescent substance 72 in adhesive layer 70 but reached light reflecting surface 62 of reflective substrate 60 can also be reflected upward (to the side of semiconductor light emitting element 100) by light reflecting surface 62. Therefore, the light emitted from light reflecting surface 62 is extracted from side surface 110b of transparent substrate 110 and from the upper surface of semiconductor light emitting element 100. Thus, the efficiency of extracting light to the outside can further be improved.

As the silicone resin is used as the material forming adhesive layer 70, it is possible to convert wavelength of light with high efficiency by fluorescent substance 72 in adhesive layer 70, since the silicone resin has high transmittance of light emitted from semiconductor light emitting element 100. Therefore, extraction of light from side surface 110b of transparent substrate 110 can be made easier.

A plurality of semiconductor light emitting devices having YAG fluorescent substances having different average particle diameters contained in the adhesive layer were fabricated, and luminous fluxes (1 m) of light emitted from these semiconductor light emitting devices were measured. Chromaticity characteristics of the semiconductor light emitting devices can be measured using a measuring device employing a d·8 (light diffusion illumination·8° viewing) optical system in accordance with JIS Z8722 condition C, DIN 5033teil7, ISOk772411. By way of example, in order to have light emission satisfying x, y=(0.259, 0.225) of CIE chromaticity table, a mixture of fluorescent substance input to the sealing member (silicone resin) and sealing member (silicone resin) mixed with the weight ratio of 2:100 was used. Here, the chromaticity mentioned above can be realized by adjusting the amounts of fluorescent substance introduced to the sealing part (silicone resin) and fluorescent substance introduced to the adhesive layer (die bonding paste).

Figure 4:
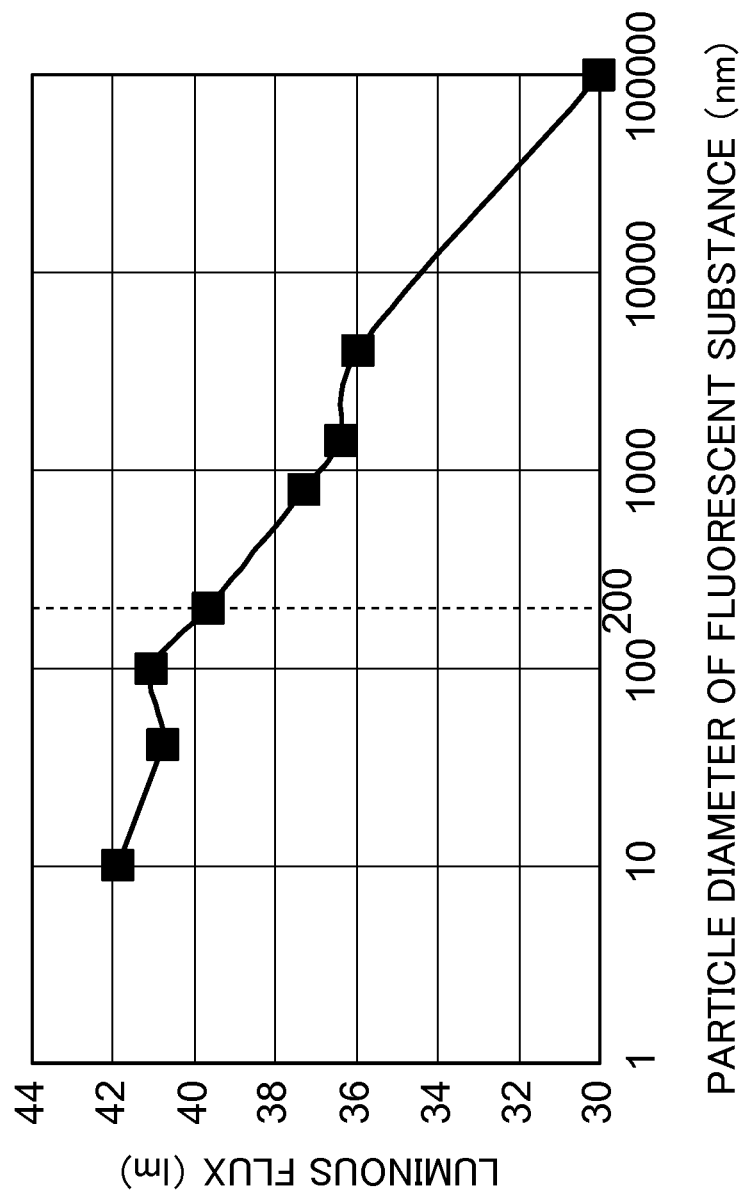
FIG. 4 shows a relation between the average particle diameter of fluorescent substance contained in the adhesive layer and the luminous flux of semiconductor light emitting device.

Referring to FIG. 4, the abscissa of FIG. 4 indicates the average particle diameter of fluorescent substance contained in the adhesive layer, and the ordinate of FIG. 4 represents the luminous flux of semiconductor light emitting device. It can be seen from FIG. 4 that as the average particle diameter of fluorescent substance becomes larger than 200 nm, the luminous flux decreases. Thus, it is confirmed that by making the average particle diameter of fluorescent substance contained in the adhesive layer to be 200 nm or smaller, it is possible to prevent decrease of luminous flux and to improve light extraction efficiency. When the average particle diameter of fluorescent substance is 100 nm or smaller, decrease in luminous flux becomes even smaller and, when the average particle diameter of fluorescent substance is made smaller than 100 nm, decrease in luminous flux becomes even still smaller. Therefore, preferably, the average particle diameter of fluorescent substance is 100 nm or smaller, and more preferably, smaller than 100 nm.

Figure 5:
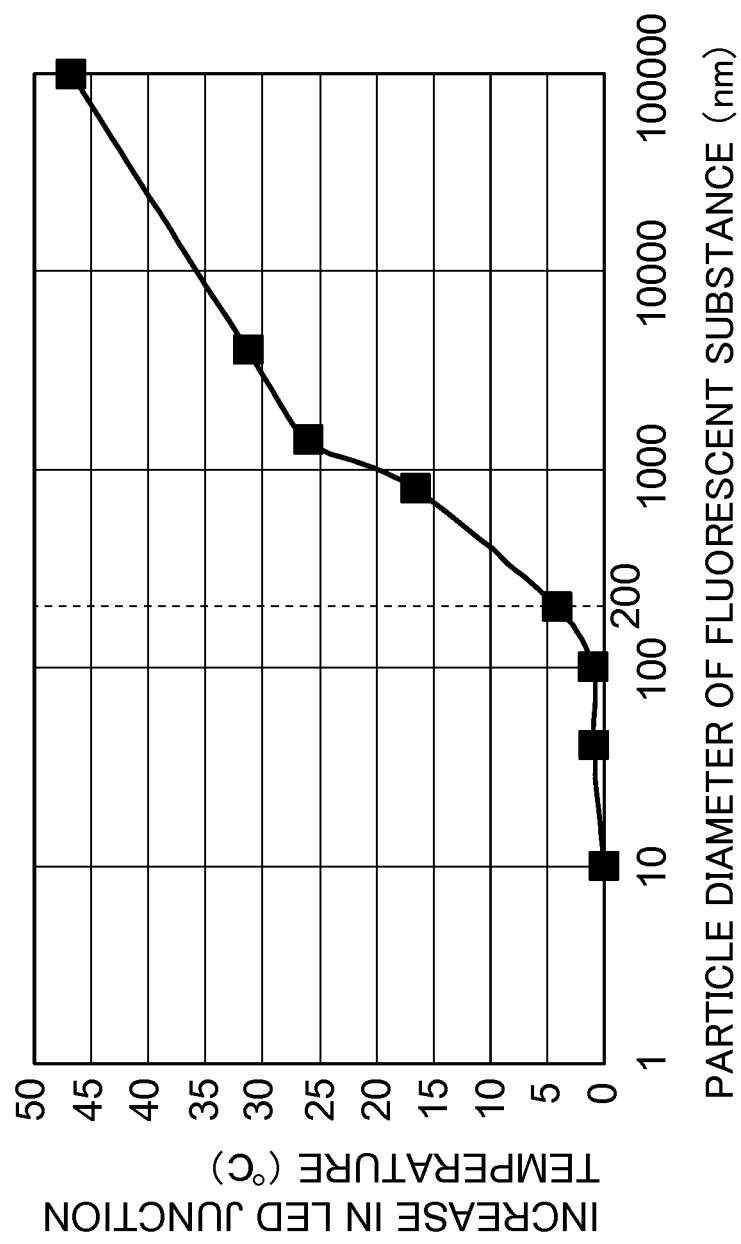
FIG. 5 shows a relation between the average particle diameter of fluorescent substance contained in the adhesive layer and the junction temperature.

Thereafter, using the same semiconductor light emitting devices as those of which luminous fluxes were measured, junction temperature was measured. The results are as shown in FIG. 5. The abscissa of FIG. 5 shows, as does the abscissa of FIG. 4, the average particle diameter of fluorescent substance contained in the adhesive layer. The ordinate of FIG. 5 shows, using a junction temperature of a semiconductor light emitting device employing fluorescent substance having the average particle diameter of 10 nm as a reference temperature, increase in junction temperature, or how much the junction temperature was increased from the reference temperature.

From FIG. 5, it is recognized that the increase in junction temperature tends to be larger as the average particle diameter of fluorescent substance becomes larger than 200 nm. The possible reason is that when the average particle diameter of fluorescent substance contained in the adhesive layer becomes larger than 200 mm, the thickness of adhesive layer increases due to the increase in average particle diameter and the heat radiating characteristic degrades, resulting in increase in junction temperature. From this, we can conclude that the reason why the luminous flux tends to be lower as the average particle diameter of fluorescent substance becomes larger than 200 nm in FIG. 4 is that the heat radiation characteristic degrades as the thickness of adhesive layer becomes thicker and hence the light emission efficiency decreases.

By making the average particle diameter of fluorescent substance contained in the adhesive layer to be equal to or smaller than 200 nm, degradation in heat radiating characteristic can be prevented and the light emission efficiency and the light extraction efficiency are improved, and this is considered to be the reason of increased luminous flux.

As Example 1 of the semiconductor light emitting device, a semiconductor light emitting device having the same structure as semiconductor light emitting device 50 described in the embodiment above was fabricated. The semiconductor light emitting device of Example 1 is a semiconductor light emitting device emitting white light. The semiconductor light emitting element mounted therein emits blue light having the peak wavelength at 450 nm.

As the adhesive layer, a die bonding paste formed of silicone resin was used. Heat resistance of the die bonding paste not containing any fluorescent substance was 0.3 $K \cdot cm^2/W$. As the fluorescent substance contained in the adhesive layer, green fluorescent substance was used, and as the fluorescent substance contained in the sealing member, red fluorescent substance was used.

As Example 2 of the semiconductor light emitting device, the same semiconductor light emitting device as Example 1 was fabricated. In Example 2, however, YAG fluorescent substance (yellow fluorescent substance) was used both as the fluorescent substance contained in the adhesive layer and the fluorescent substance contained in the sealing member. The average particle diameter of fluorescent substance contained in the adhesive layer was made 50 nm or smaller.

In the semiconductor light emitting device in accordance with the present embodiment, a fluorescent substance emitting fluorescent light having longer wavelength than the fluorescent substance contained in the sealing member is contained in the adhesive layer. Except for this point, the structure is the same as that of semiconductor light emitting device 50 in accordance with the first embodiment described above.

Since the fluorescent substance emitting fluorescent light of longer emission wavelength than the fluorescent substance contained in the sealing member is contained in the adhesive layer, it is possible to prevent the light (fluorescent light) emitted from the fluorescent substance in the adhesive layer from being absorbed by the fluorescent substance in the sealing member. Thus, the efficiency of extracting light to the outside can further be improved.

As described above, it is preferred that the adhesive layer contains at least one fluorescent substance that emits fluorescent light of longer wavelength than the emission wavelength of fluorescent substance contained in the sealing member. A structure in which the adhesive layer contains at least one fluorescent substance emitting fluorescent light of comparable wavelength as the emission wavelength of fluorescent substance contained in the sealing member is also a preferred structure.

The semiconductor light emitting device of Example 3 is a semiconductor light emitting device emitting white light. The semiconductor light emitting element mounted therein emits blue light having the peak wavelength at 450 nm. In Example 3, the fluorescent substance contained in the sealing member is green fluorescent substance, and the fluorescent substance contained in the sealing member is red fluorescent substance. Except for this point, the structure is the same as that of semiconductor light emitting device of Example 1 above.

In the semiconductor light emitting device of Example 3, the light converted to red by the red fluorescent substance in the adhesive layer is reflected from the surface of reflective substrate (package), emitted from the surface of semiconductor light emitting element, the side surface of transparent substrate and the like, and emitted to the inside of sealing member. Since the red light emitted to the sealing member has long wavelength, possibility of re-absorption by the green fluorescent substance in the sealing member is low. Therefore, the light extraction efficiency can further be improved.

The semiconductor light emitting device in accordance with Example 4 is substantially the same as the semiconductor light emitting device of Example 3. Example 4 is different from Example 3, however, in that the fluorescent substance contained in the adhesive layer is yellow fluorescent substance (YAG fluorescence substance).

Use of yellow fluorescent substance as the fluorescent substance contained in the adhesive layer as described above is also preferred, as the possibility of re-absorption by the green fluorescent substance contained in the sealing member is low, from the above-described reason.

The semiconductor light emitting device in accordance with the present embodiment differs from the first embodiment in that a transparent substrate formed of a nitride semiconductor is used as the semiconductor light emitting element as the light source. As the transparent substrate formed of a nitride semiconductor, a c-plane GaN substrate is used. Except for this point, the structure is the same as that of the first embodiment.

In the present embodiment also, tendencies similar to those of the first embodiment were observed. Further, as to the effect of improving luminous flux attained by making smaller the average particle diameter of fluorescent substance contained in the adhesive layer, further improvement of a few % than the example using a sapphire substrate was observed. In a semiconductor light emitting element using a GaN substrate as the transparent substrate, since the refractive index of substrate is as large as 2.5 as compared with 1.78 of sapphire substrate, the light extraction efficiency from the side surface of the substrate becomes lower than in the semiconductor light emitting element using a sapphire substrate. Therefore, it is considered that the luminous flux (light output) was improved because the present structure positively worked with respect to the light extraction efficiency from the side surface. Further, it may also be a reason that the heat transmission of GaN substrate is higher than that of sapphire substrate and hence, the increase in junction temperature could be made smaller.

It is noted that when a SiC substrate was used as the transparent substrate, similar effects as when the GaN substrate was used as the transparent substrate could be attained. The reason for this is considered that a SiC substrate has a large refraction index as does the GaN substrate and, hence, the improving effect worked positively. Thus, the SiC substrate was also found to be effective.

The semiconductor light emitting device in accordance with the present embodiment has an ultraviolet LED (semiconductor light emitting element) having an emission wavelength of 300 nm mounted therein. In the present embodiment, the composition and thickness of MQW light emitting layer are adjusted to emit the ultraviolet light having the emission wavelength of 300 nm. Specifically, the MQW light emitting layer is a light emitting layer of InAlGaN quaternary mixed crystal having In added to AlGaN. A few % of In is added to AlGaN of which Al composition ratio is 70% to 90%. The wavelength also differs depending on the thickness of light emitting layer (barrier layer, well layer). Therefore, the composition and thickness are appropriately adjusted to adjust the wavelength.

Further, in the present embodiment, blue fluorescent substance is introduced to the sealing member, and thereby the chromaticity is adjusted using fluorescent substances of three colors of RGB. The semiconductor light emitting device in accordance with the present embodiment also had the same tendency as the first embodiment described above, and similar effects were attained.

The semiconductor light emitting device in accordance with the present embodiment has substantially the same structure as the first embodiment described above. It is noted, however, that in the present embodiment, CdSe nano particles are used as the fluorescent substance introduced to the adhesive layer. The emission wavelength can be changed by changing the particle size of CdSe nano particles. When the particle diameter is 2.5 nm, blue fluorescent light having the wavelength of 450 nm is emitted, when the particle diameter is 3.3 nm, green fluorescent light having the wavelength of 520 nm is emitted, and when the particle diameter is 5.2 nm, red fluorescent light having the wavelength of 630 nm is emitted. In the present embodiment, fluorescent substance having the average particle diameter of 3.3 nm and the fluorescent substance having the average particle diameter of 5.2 nm were used. In this manner, fluorescent substances of the same material different only in particle diameter and hence emitting different emission colors may be used. Here again, increase in junction temperature was not observed as compared with the example not containing any fluorescent substance, and a light emitting device of satisfactory light emitting characteristics could be obtained.

In the embodiments above, examples using a sapphire substrate and a c-plane Gan substrate as the transparent substrate were described. The present invention, however, is not limited to these embodiments. The transparent substrate may be any substrate that passes light emitted from itself. Examples of such transparent substrates include a single crystal transparent substrate such as a nitride semiconductor substrate, an SiC substrate and a quartz substrate. As the nitride semiconductor substrate, a substrate formed of $AlGa_yIn_zN$ ($0 \le x \le 1$, $0 \le y \le 1$, $0 \le z \le 1$, $x+y+z=1$) may be used. The nitride semiconductor substrate may be doped with Si, O, Cl, S, C, Ge, Zn, Cd, Mg or Be. For an n-type nitride semiconductor substrate, of these doping materials, Si, O and Cl are particularly preferable. Further, as the nitride semiconductor substrate, a non-polar substrate may be used. The non-polar substrate includes apolar substrate and semipolar substrate. The main surface orientation of apolar substrate may be A plane {11-20}, M plane {1-100} and {1-101} plane. The main plane orientation of semipolar substrate includes {20-21} plane, which is known to have high light emission efficiency in, for example, green range. The present invention is also applicable to nitride semiconductor substrates having such main surface orientations.

When a sapphire substrate is used as the transparent substrate, the upper surface of the substrate may be a flat plane, or it may be a PSS (Patterned Sapphire Substrate) having rough shapes formed on the upper surface, such as described in Japanese Patent Laying-Open No. 2008-177528.

In the embodiment above, an example using a transparent substrate having the thickness of about 120 μm has been described. The present invention, however, is not limited to such an embodiment. The thickness of transparent substrate is not specifically limited, and a transparent substrate having the thickness of at least 20 μm to at most 500 μm (preferably, at least 80 μm and at most 300 μm) may appropriately be used.

In the embodiment above, the n-type impurity to be doped in each of the n-type layers is not specifically limited. It may be Si, P, As, Sb or the like, and preferably, it is Si. Further, the super lattice layer may have a super lattice structure formed by stacking at least one semiconductor layer different from the wide band gap layer or narrow band gap layer, a wide band gap layer, and a narrow band gap layer.

In the embodiment above, an example using a transparent electrode of ITO has been described. The present invention, however, is not limited to such an embodiment. As the transparent electrode, a transparent conductive film such as IZO (Indium Zinc Oxide) or the like may be used, other than the ITO. Further, the n-side electrode may be W/Al, Ti/Al, Ti/Al/Ni/Au, W/Al/W/Pt/Au, Al/Pt/Au or the like, other than those described above.

Though an example using a transparent protective film formed of $SiO_2$ has been described, the present invention is not limited to such an embodiment. As the transparent protective film, $ZrO_2$, $TiO_2$, $Al_2O_3$ or an oxide containing at least one element selected from the group consisting of V, Zr, Nb, Hf and Ta, SiN, BN, SiC, AN, AlGaN or the like may be used, other than $SiO_2$. Preferably, the transparent protective film is an insulating film.

In the embodiment above, an example in which the n-side electrode and the p-side electrode are formed to include a protruding portion (branch electrode) has been described. The present invention, however, is not limited to such an embodiment. The n-side and p-side electrodes may have a structure not including the branch electrode. Further, an insulating layer for preventing current injection at a lower portion of p-side electrode may be provided at a region immediately below the p-side electrode.

In the embodiment above, an example in which a fluorescent substance having large particle diameter is used as the fluorescent substrate contained in the sealing member has been described. The present invention, however, is not limited to such an embodiment. By way of example, the sealing member may contain a fluorescent substance having the average particle diameter comparable to that of the fluorescent substance contained in the adhesive layer. In that case, it is possible that the thickness of adhesive layer becomes larger than the average particle diameter of fluorescent substance contained in the sealing member. Even in that case, increase in thickness of adhesive layer can be prevented by making the average particle diameter of fluorescent substance contained in the adhesive layer to be 200 nm or smaller and, therefore, decrease in light emission efficiency caused by the lower heat radiation characteristic can be prevented.

In the embodiment above, an example in which the chromaticity and the like of the semiconductor light emitting device are controlled mainly by the fluorescent substance in the sealing member has been described. The present invention, however, is not limited to such an embodiment. By way of example, the chromaticity of the semiconductor light emitting device may be controlled mainly by the fluorescent substance in the adhesive layer.

In the embodiment above, an example in which a die bonding paste of silicone resin is used as the die bonding paste forming the adhesive layer has been described. The present invention, however, is not limited to such an embodiment. As the die bonding paste, one formed of thermo setting resin such as epoxy resin, acrylic resin, imide resin and the like may be used other than the silicone resin.

In the embodiment described above, the semiconductor light emitting element may be die-bonded using a conventionally used die bonding paste (resin).

In the embodiment above, an example in which a reflective substrate formed of a metal core substrate as the package base has been described. The present invention, however, is not limited to such an embodiment. Various reflecting substrate other than the metal core substrate may be used as the reflecting substrate. By way of example, a ceramic substrate using alumina ($Al_2O_3$) or aluminum nitride (AlN), an organic substrate using resin such as FR-4 (Flame Retardant Type 4), BT resin (Bismaleimide-Triazine Resin), a composite substrate having copper/resin mixed therein may be used as the reflecting substrate. A substrate of aluminum nitride has low reflectance and, therefore, it may be plated with Ag or coated with white resin having high reflectance.

As to the configuration of package (PKG) of semiconductor light emitting device, it may be different from the package configuration described in the embodiment above. In a pre-mold PKG, by way of example, PPO resin (polyphenylene oxide resin) may be used and in a ceramic PKG, by way of example, alumina ($Al_2O_3$), aluminum nitride (AlN) or the like may be used as the material of package substrate (reflective substrate). A sintered ceramic substrate of, for example, alumina, may be used directly as a reflective substrate having a high reflectance of 90% or higher. From the viewpoint of light extraction efficiency, the reflectance of the surface (light reflecting surface) of reflective substrate is preferably 80% or higher in the visible range.

In the embodiment above, an example in which one semiconductor light emitting element is mounted on a semiconductor light emitting device (package) has been described.

The present invention, however, is not limited to such an embodiment. A plurality of semiconductor light emitting elements may be mounted on a semiconductor light emitting device (package). In that case, the adhesive layers fixing respective light emitting elements may contain the same type of fluorescent substance or may contain fluorescent substances of different types.

Further, in the embodiment above, the adhesive layer and the sealing member may contain one type of fluorescent substance, or a plurality of different types of fluorescent substances.

Any embodiment or embodiments attained by appropriately combining the techniques disclosed above are also encompassed by the technical scope of the present invention.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

By the present invention, a semiconductor light emitting device capable of improving the efficiency of extracting light to the outside can be provided.

REFERENCE SIGNS LIST

50 semiconductor light emitting device
60 reflective substrate
62 light reflecting surface
64, 66 lead terminals
70 adhesive layer
72, 82 fluorescent substance
80 sealing member
90, 92 wire
100 semiconductor light emitting element
110 transparent substrate
110b side surface
120 n-type layer
130 MQW light emitting layer
140 p-type layer
150 multi-layered structure
160 n-side electrode
180 p-side electrode

The invention claimed is:

1. A semiconductor light emitting device, comprising:
a semiconductor light emitting element including a transparent substrate;
a substrate on which said semiconductor light emitting element is mounted;
an adhesive layer containing a fluorescent substance, for fixing said semiconductor light emitting element on said substrate; and
a sealing member containing a fluorescent substance, for sealing said semiconductor light emitting element; wherein
the fluorescent substance contained in the adhesive layer has an average particle diameter smaller than an average particle diameter of the fluorescent substance contained in the sealing member; and
said adhesive layer has a thickness equal to or smaller than an average particle diameter of said fluorescent substance contained in said sealing member.

2. The semiconductor light emitting device according to claim 1, wherein
average particle diameter of the fluorescent substance contained in said adhesive layer is at most 200 nm.

3. The semiconductor light emitting device according to claim 2, wherein
average particle diameter of the fluorescent substance contained in said adhesive layer is at most 100 nm.

4. The semiconductor light emitting device according to claim 1, wherein
said substrate has a light reflecting surface; and
said semiconductor light emitting element is mounted on said light reflecting surface.

5. The semiconductor light emitting device according to claim 1, wherein
the fluorescent substance contained in said adhesive layer emits fluorescent light having longer emission wavelength than the fluorescent substance contained in said sealing member.

6. The semiconductor light emitting device according to claim 1, wherein
said transparent substrate is any of a sapphire substrate, a nitride-based semiconductor substrate and an SiC substrate.

7. The semiconductor light emitting device according to claim 1 wherein
said adhesive layer is formed of silicone resin.

* * * * *